United States Patent
Ni

(10) Patent No.: US 12,063,810 B2
(45) Date of Patent: Aug. 13, 2024

(54) DISPLAY SUBSTRATE MOTHERBOARD, DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventor: Jingkai Ni, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 434 days.

(21) Appl. No.: 17/625,980

(22) PCT Filed: Jan. 22, 2021

(86) PCT No.: PCT/CN2021/073370
§ 371 (c)(1),
(2) Date: Jan. 10, 2022

(87) PCT Pub. No.: WO2021/148007
PCT Pub. Date: Jul. 29, 2021

(65) Prior Publication Data
US 2022/0384761 A1    Dec. 1, 2022

(30) Foreign Application Priority Data
Jan. 23, 2020 (CN) .......................... 202010076888.2

(51) Int. Cl.
*H01L 51/52* (2006.01)
*H01L 27/32* (2006.01)
(Continued)

(52) U.S. Cl.
CPC ......... *H10K 50/844* (2023.02); *H10K 59/122* (2023.02); *H10K 59/124* (2023.02); *H10K 71/00* (2023.02); *H10K 59/1201* (2023.02)

(58) Field of Classification Search
CPC .. H10K 50/844; H10K 59/122; H10K 59/124; H10K 71/00; H10K 59/1201;
(Continued)

(56) References Cited

U.S. PATENT DOCUMENTS

2018/0363135 A1* 12/2018 Huang .............. C23C 16/45525
2020/0006703 A1*  1/2020 Zhang .................. H10K 59/122
(Continued)

FOREIGN PATENT DOCUMENTS

CN        107403877 A       11/2017
CN        109560114 A        4/2019
(Continued)

OTHER PUBLICATIONS

Office Action for application 202010076888.2 issued by the Chinese Intellectual Property Office on Mar. 2, 2022.

*Primary Examiner* — Tracie Y Green
(74) *Attorney, Agent, or Firm* — IP & T GROUP LLP

(57) ABSTRACT

A display substrate motherboard has display areas and at least one cutting area located at least among the display areas. The display substrate motherboard includes a base substrate, first barrier groups disposed on the base substrate, an inert material layer and a first inorganic insulating layer. Each first barrier group is located on at least one side of a corresponding display area and includes two first barriers. A region between the two first barriers is located in a cutting area. The inert material layer is disposed in the region. The first inorganic insulating layer is disposed on a side of the first barrier groups away from the base substrate, and is further located in the display areas. An orthogonal projection of the first inorganic insulating layer on the base substrate is non-overlapping with an orthogonal projection of the inert material layer on the base substrate.

20 Claims, 10 Drawing Sheets

(51) Int. Cl.
  *H01L 51/56*    (2006.01)
  *H10K 50/844*   (2023.01)
  *H10K 59/122*   (2023.01)
  *H10K 59/124*   (2023.01)
  *H10K 71/00*    (2023.01)
  *H10K 59/12*    (2023.01)

(58) Field of Classification Search
  CPC ...... H10K 71/851; H10K 77/10; H10K 59/12; H10K 50/8428
  See application file for complete search history.

(56) References Cited

U.S. PATENT DOCUMENTS

| 2021/0359284 A1 | 11/2021 | Li et al. |
| 2022/0045273 A1 | 2/2022 | Li et al. |
| 2022/0238822 A1* | 7/2022 | Lu ........................ H10K 59/131 |

FOREIGN PATENT DOCUMENTS

| CN | 110165081 A | 8/2019 |
| CN | 110690262 A | 1/2020 |
| CN | 110718647 A | 1/2020 |
| CN | 111244327 A | 6/2020 |

\* cited by examiner

DISPLAY SUBSTRATE MOTHERBOARD, DISPLAY SUBSTRATE AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN2021/073370, filed on Jan. 22, 2021, which claims priority to Chinese Patent Application No. 202010076888.2, filed on, Jan. 23, 2020, which are incorporated herein by reference in their entirety.

TECHNICAL FIELD

The present disclosure relates to the field of display technologies, and in particular, to a display substrate motherboard, a display substrate and a manufacturing method therefor, and a display apparatus.

BACKGROUND

The display substrate includes a plurality of patterned inorganic insulating layers.

At present, a manufacturing method for a patterned inorganic insulating layer includes a photo-etching process. Alternatively, an inorganic insulating layer in a pre-prepared template is formed, and then the inorganic insulating layer is separated from the template to obtain an inorganic insulating layer with a certain pattern.

SUMMARY

In a first aspect, a display substrate motherboard is provided. The display substrate motherboard has a plurality of display areas and at least one cutting area located at least among the plurality of display areas. The display substrate motherboard includes a base substrate, a plurality of first barrier groups, an inert material layer and a first inorganic insulating layer. The plurality of first barrier groups are disposed on the base substrate. Each first barrier group is located on at least one side of a corresponding display area and includes two first barriers arranged at intervals, and a region between the two first barriers is located in a cutting area. The inert material layer is disposed in the region between the two first barriers. The first inorganic insulating layer is disposed on a side of the plurality of first barrier groups away from the base substrate, and the first inorganic insulating layer is further located in the plurality of display areas. An orthogonal projection of the first inorganic insulating layer on the base substrate is non-overlapping with an orthogonal projection of the inert material layer on the base substrate.

In some embodiments, the two first barriers are both disposed around the corresponding display area. The first inorganic insulating layer includes a plurality of first inorganic insulating sub-layers, and each first inorganic insulating sub-layer is located in a corresponding display area and in a region where a first barrier group corresponding to the display area is located.

In some embodiments, the display substrate motherboard further includes one or more sub-barriers. At least one sub-barrier is located in a region between two first barriers of at least one first barrier group. The at least one sub-barrier and the two first barriers are disposed in a same layer. The inert material layer covers the one or more sub-barriers.

In some embodiments, the first barrier group is disposed on a surface of the base substrate, and the surface has one or more grooves. At least one groove is located in a region between two first barriers of at least one first barrier group, and the inert material layer covers the one or more grooves. Alternatively, the display substrate motherboard further includes a dielectric layer disposed between the base substrate and the first barrier group. The first barrier group is disposed on a surface of the dielectric layer away from the base substrate, and the surface has one or more grooves. At least one groove is located in a region between two first barriers of at least one first barrier group, and the inert material layer covers the one or more grooves.

In some embodiments, the display substrate motherboard further includes a plurality of second barrier groups and a second inorganic insulating layer disposed on a side of the second barrier groups away from the base substrate. The plurality of second barrier groups are disposed on the base substrate. An orthogonal projection of each second barrier group on the base substrate is non-overlapping with an orthogonal projection of any first barrier group of the plurality of first barrier groups on the base substrate. The second barrier group includes at least two adjacent second barriers, and the at least two adjacent second barriers having a gap region therebetween. The second inorganic insulating layer is provided with a plurality of via holes therein. An orthogonal projection of the gap region on the base substrate is overlapping with an orthogonal projection of a via hole on the base substrate.

In a second aspect, a display substrate is provided. The display substrate has a display area. The display substrate includes a base sub-substrate, a first barrier disposed on the base sub-substrate, an inert material pattern disposed between the first barrier and an edge of the base sub-substrate, and a first inorganic insulating sub-layer disposed on a side of the first barrier away from the base sub-substrate. The first barrier is located on at least one side of the display area, and the first barrier and an edge of the base sub-substrate have a gap therebetween at any side of the display area. The first inorganic insulating sub-layer is further located in the display area. An orthogonal projection of an edge of the first inorganic insulating sub-layer on the base sub-substrate is located within a range of an orthogonal projection of the first barrier on the base sub-substrate at the any side of the display area.

In some embodiments, the first barrier is disposed around the display area, and orthogonal projections of edges of the first inorganic insulating sub-layer on the base sub-substrate are located within the range of the orthogonal projection of the first barrier on the base sub-substrate.

In some embodiments, the display substrate further includes a planarization layer disposed on the base sub-substrate and located in the display area, and/or, a pixel defining layer disposed on the base sub-substrate and located in the display area. The first barrier is disposed in a same layer as one of the planarization layer and the pixel defining layer.

In some embodiments, the display substrate further includes at least one barrier dam disposed on the base sub-substrate. The at least one barrier dam is disposed at a side of the first barrier proximate to the display area, and each of the at least one barrier dam being disposed around the display area.

In some embodiments, the at least one barrier dam includes a first barrier dam and a second barrier dam. The second barrier dam and the first barrier dam are arranged at intervals in a direction perpendicular to a thickness direction of the base sub-substrate. The first barrier dam is disposed around the display area, and the second barrier dam is disposed around the first barrier dam. In the thickness direction of the base substrate, a minimum distance from a surface of the second barrier dam away from the base sub-substrate to the base sub-substrate is greater than a minimum distance from a surface of the first barrier dam away from the base sub-substrate to the base sub-substrate.

In some embodiments, the display substrate further includes at least one second barrier group disposed on the base sub-substrate and a second inorganic insulating sub-layer disposed on a side of the second barrier groups away from the base sub-substrate. An orthogonal projection of the at least one second barrier group on the base sub-substrate is non-overlapping with the orthogonal projection of the first barrier on the base sub-substrate. Each second barrier group includes at least two adjacent second barriers, and the at least two adjacent second barriers having a gap region therebetween. The second inorganic insulating sub-layer is provided with at least one via hole therein. An orthogonal projection of the gap region on the base sub-substrate is overlapping with an orthogonal projection of a via hole on the base sub-substrate.

In a third aspect, a display apparatus is provided. The display apparatus includes the display substrate according to any one of the above embodiments.

In a fourth aspect, a manufacturing method for a display substrate is provided. The method includes: providing a base substrate; the base substrate having a plurality of display areas and at least one cutting area located at least among the plurality of display areas; forming a first barrier group including two first barriers on the base substrate and located on at least one side of each display area, a region between the two first barriers being located in a cutting area; forming an inert material layer in a region between two first barriers of each first barrier group; forming a first inorganic insulating layer on a side of all first barrier groups away from the base substrate, the first inorganic insulating layer being further located in the plurality of display areas, an orthogonal projection of the first inorganic insulating layer is non-overlapping with an orthogonal projection of the inert material layer on the base substrate; and cutting along at least one cutting line in the cutting area to obtain display substrates each according to any one of the above embodiments.

In some embodiments, forming the inert material layer in the region between the two first barriers of each first barrier group includes: filling the region between the two first barriers of each first barrier group with a first organic material to form the inert material layer.

In some embodiments, the first barrier group is located on a surface of the base substrate, before filling the region between the two first barriers of each first barrier group with the first organic material, forming the inert material layer further includes: pre-treating the surface of the base sub-strate to make the surface of the base substrate have hydroxyl groups, so that the first organic material reacts with the hydroxyl groups after the region is filled with the first organic material, to form the inert material layer.

In some embodiments, before forming the first barrier group, the method further includes: forming a dielectric layer on the base substrate. Before filling the region between the two first barriers of each first barrier group with the first organic material, forming the inert material layer further includes: pre-treating a surface of the dielectric layer away from the base substrate to make the surface of the dielectric layer away from the base substrate have hydroxyl groups, so that the first organic material reacts with the hydroxyl groups after the region is filled with the first organic material, to form the inert material layer.

In some embodiments, the first organic material includes one of vinyltriethoxysilane, vinyltriacetoxysilane, or chloromethyltriethoxysilane.

In some embodiments, forming the inert material layer in the region between the two first barriers of each first barrier group includes: filling the region between the two first barriers of each first barrier group with a second organic material, the second organic material including one of a polystyrene-based material, a polyethylene oxides-based material, a polymethyl methacrylate-based material and a polyvinylpyrrolidone-based material.

In some embodiments, the method further includes: forming a plurality of barrier dams on the base substrate, each display area being surrounded by at least one barrier dam, and the at least one barrier dam being disposed at a side of the first barrier group, corresponding to the display area, proximate to the display area.

In some embodiments, the base substrate has a plurality of display substrate areas, a display area is located in a corresponding display substrate area, and the at least one cutting area is located at least among the plurality of display substrate areas. The method further includes: forming at least one second barrier group in each display substrate area of the base substrate, each second barrier group including at least two adjacent second barriers, the at least two adjacent second barriers having a gap region therebetween, and an orthogonal projection of the at least one second barrier group on the base substrate is non-overlapping with an orthogonal projection of the first barrier group on the base substrate; forming an inert organic film in the gap region; forming a second inorganic insulating layer in the display substrate area and on a side of all second barrier groups away from the base substrate; removing the inert organic film layer formed in the gap region.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
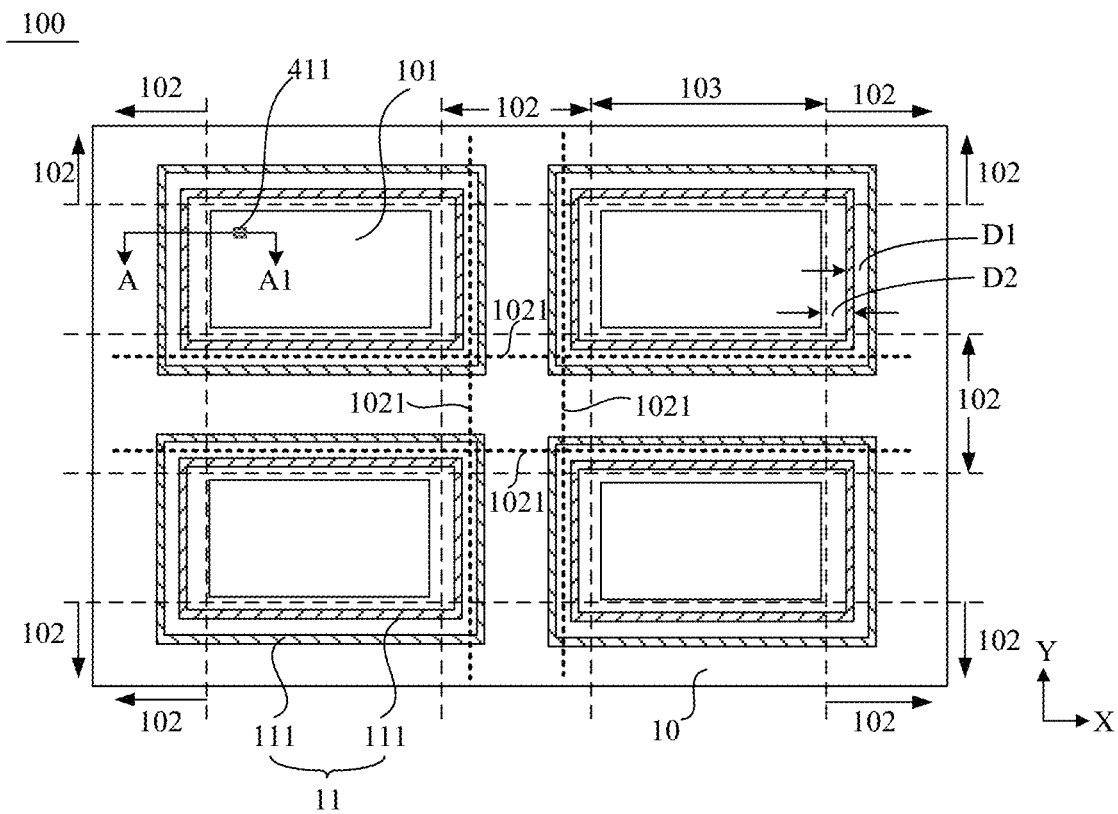
FIG. 1 is a schematic top view of a display substrate motherboard, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and derivatives thereof may be used. For example, the term "connected" may be used when describing some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

It will be understood that, when a layer or element is referred to as being on another layer or substrate, it may be directly on the another layer or substrate, or intervening layer(s) may also be present.

The term "same layer" refers to a layer structure formed through the same patterning process by using the same mask in which a film layer for forming a specific pattern is formed by using the same film-forming process. The patterning process may include exposure, development and etching processes, and the specific patterns in the formed layer structure may be continuous or discontinuous, and these specific patterns may also be at different heights or have different thicknesses.

Exemplary embodiments are described herein with reference to sectional views and/or plan views as idealized exemplary drawings. In the accompanying drawings, thickness of layers and regions are enlarged for clarity. Exemplary embodiments of the present disclosure should not be construed to be limited to shapes of regions shown herein, but to include deviations in shape due to, for example, manufacturing. For example, an etched area shown as a rectangle generally has a curved feature. Therefore, the areas shown in the accompanying drawings are schematic in nature, and their shapes are not intended to show actual shapes of the area in a device, and are not intended to limit the scope of the exemplary embodiments.

Figure 2:
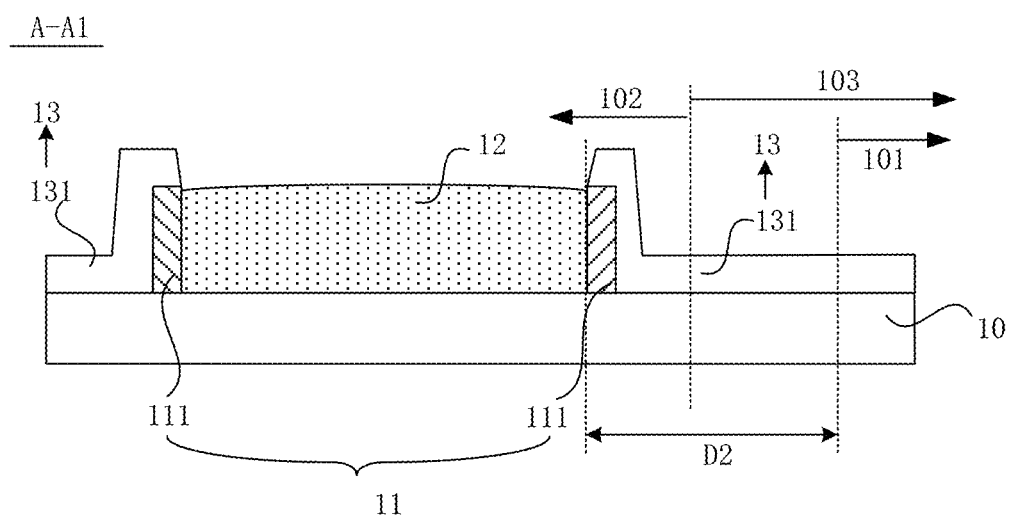
FIG. 2 is a sectional view showing a structure taken along the line A-A1 of the display substrate motherboard in FIG. 1, in accordance with some embodiments.

Some embodiments of the present disclosure provide a display substrate motherboard 100, as shown in FIGS. 1 and 2, the display substrate motherboard 100 has a plurality of display substrate areas 103, a plurality of display areas 101 and cutting area(s) 102 located outside of the plurality of display areas 101. A display area 101 is located in a corresponding display substrate area 103. The cutting area (s) 102 and the display substrate areas 103 are non-overlapping with each other. The plurality of display areas 101 are arranged in a plurality of rows and a plurality of columns on the display substrate motherboard 100.

FIG. 1 is illustrated by taking an example in which there are four display areas 101 on the display substrate motherboard. The four display areas 101 are arranged in two rows in an X direction and two columns in a Y direction on the display substrate motherboard. The cutting areas 102 are located outside of each display area 101. For example, a cutting area 102 is located between every two adjacent display areas 101. For another example, for a display area located at the outermost side of the display substrate motherboard, a cutting area 102 is located at a side of the display area 101 proximate to an edge of the display substrate motherboard. After cutting along cutting lines 1021 parallel to the X direction and cutting lines 1021 parallel to the Y direction in the cutting areas 102, a plurality of individual display substrates may be obtained.

As shown in FIGS. 1 and 2, the display substrate motherboard 100 includes a base substrate 10 and a plurality of first barrier groups 11 disposed on the base substrate 10. Each first barrier group 11 is located on at least one side of a corresponding display area 101, and includes two first barriers 111. The two first barriers 111 of each first barrier group 11 are disposed in a same layer and at intervals. A region between the two first barriers 111 of each first barrier group 11 is located in a cutting area 102.

In some examples, as shown in FIG. 1, each first barrier group 11 is disposed around a corresponding display area 101. In some other examples, each first barrier group 11 is disposed on a side of a corresponding display area 101. In yet some other examples, each first barrier group 11 is disposed on opposite sides or two adjacent sides of a corresponding display area 101. Alternatively, it may be that a plurality of first barrier groups 11 are located on different sides of a same display area 101, and the plurality of first barrier groups 11 located on the different sides of the same display area 101 may be connected end to end or may not be connected. The embodiments of the present disclosure does not limit thereto, as long as the two first barriers 111 in each barrier group 11 are arranged at intervals.

As shown in FIG. 2, the display substrate motherboard 100 further includes an inert material layer 12 disposed in the region between the two first barriers 111, and a first inorganic insulating layer 13 disposed on a side of each first barrier group 11 away from the base substrate 10. The first inorganic insulating layer 13 is further located in each display area 101. An orthogonal projection of the first inorganic insulating layer 13 on the base substrate 10 is non-overlapping with an orthogonal projection of the inert material layer 12 on the base substrate 10.

The inert material layer 12 is provided between the two first barriers 111 of each first barrier group 11. In the embodiments of the present disclosure, a material of the inert material layer is an inert organic material. In this way, when an inorganic insulating film is deposited on a side of the first barrier groups 11 away from the base substrate 10, since the inorganic insulating film does not chemically react with the inert organic material, the inorganic insulating film cannot be attached to the inert material layer 12, so that the first inorganic insulating layer 13 with a certain pattern may be directly obtained by a deposition process. In this way, a process of manufacturing the patterned first inorganic insulating layer 13 in the embodiments of the present disclosure may omit processes of exposure, development, etching, peeling, etc.

Figure 3:
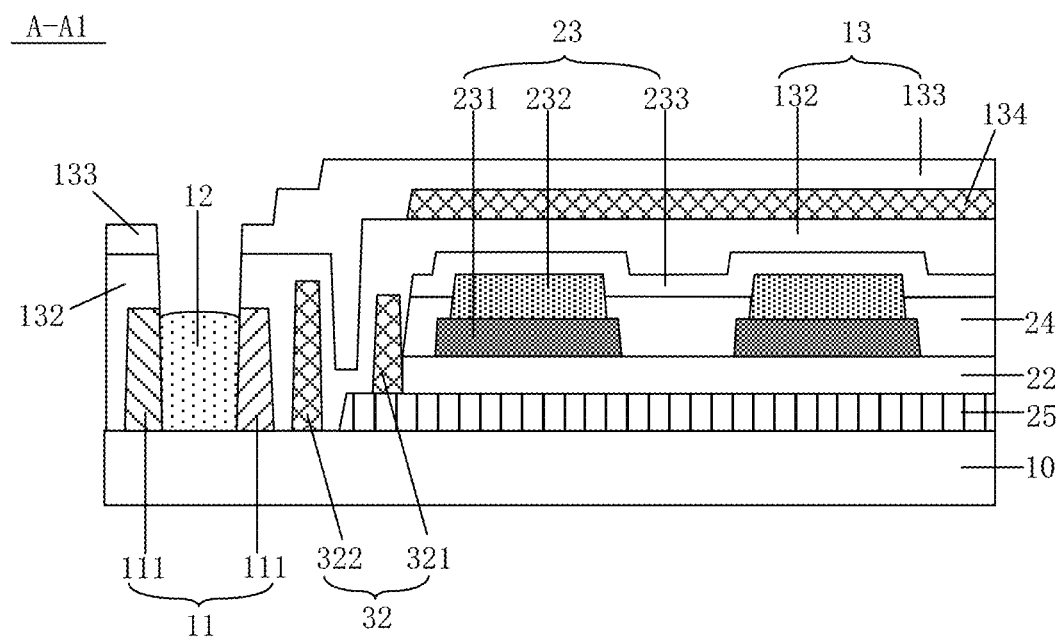
FIG. 3 is a sectional view showing another structure taken along the line A-A1 of the display substrate in FIG. 1, in accordance with some embodiments.

In some embodiments, as shown in FIG. 3, the display substrate motherboard 100 includes a first inorganic encapsulation layer 132 and a second inorganic encapsulation layer 133 that are stacked. The first inorganic encapsulation layer 201 and the second inorganic encapsulation layer 133 may prevent moisture and oxygen entering from a side of the display substrate motherboard away from the base substrate from intruding into the interior of the display substrates, and affecting light-emitting devices in the display substrates. An inorganic material of each of the first inorganic encapsulation layer 132 and the second inorganic encapsulation layer 133 is, for example, silicon nitride and/or silicon oxide. The material of the first inorganic encapsulation layer 132 may be the same as or different from the material of the second inorganic encapsulation layer 133.

In the embodiments of the present disclosure, the first inorganic insulating layer 13 includes the first inorganic encapsulating layer 132 and the second inorganic encapsulating layer 133 above mentioned. That is, the first inorganic insulating layer 13 in the embodiments of the present disclosure may be used for encapsulation of the display substrate.

Since the orthogonal projection of the first inorganic insulating layer 13 on the base substrate 10 is non-overlapping with the orthogonal projection of the inert material layer 12 on the base substrate 10, when the display substrate motherboard 100 is cut to form a plurality of display substrates, cutting may be performed on the region between the two first barriers 111 of the first barrier group 11, so that the organic inert material layer 12 is actually cut. Since a flexibility of organic materials is greater than a flexibility of inorganic materials, a situation of cracking of inorganic insulating materials during cutting may be improved.

In addition, if the first inorganic insulating layer 13 is formed by a method using mask, a size of a film-forming region of the inorganic insulating film is much larger than a design size of the first inorganic insulating layer 13, which may cause a shadow at edges of the first inorganic insulating layer 13 is large, so that it is not conducive to a narrow bezel design for a display apparatus in a case where the display substrate is applied to the display apparatus. In the embodiments of the present disclosure, when the patterned first inorganic insulating layer is formed on the side of the first barrier groups 11 away from the base substrate, the mask is not employed, so that there is no shadow at the edges, which is beneficial to the narrow bezel design for the display apparatus.

In some embodiments, as shown in FIG. 3, the display substrate motherboard 100 further includes a planarization layer 22 disposed on the base substrate 10 and located in the display area 101. For example, the first barriers 111 and the planarization layer 22 may be disposed in a same layer, that is, the first barriers 111 and the planarization layer 22 are formed through a same patterning process. For example, a material of the planarization layer 22 includes, but is not limited to, a polysiloxane-based material, an acrylic-based material or a polyimide-based material.

In some other embodiments, as shown in FIG. 3, the display substrate motherboard 100 further includes a pixel defining layer 24 disposed on the base substrate 10 and located in the display area 101. For example, the first barriers 111 and the pixel defining layer 24 may be disposed in a same layer, that is, the first barriers 111 and the pixel defining layer 24 are formed through a same patterning process.

In some examples, as shown in FIG. 3, the pixel defining layer 24 is disposed on a side of the planarization layer 22 away from the base substrate 10.

For example, a material of the pixel defining film 24 is photoresist. The photoresist may include one or more of polyimide, organosilane or polymethyl methacrylate.

In this way, in the embodiments of the present disclosure, when the patterned first inorganic insulating layer 13 is formed by using the first barrier group 11, not only the processes of exposure, development, etching, and peeling, which employed in a general formation of the patterned inorganic insulating layer, may be omitted, but also no additional process is added, thereby greatly saving a manufacturing cost of the display substrate. In some embodiments, as shown in FIG. 1, the two first barriers 11 in each first barrier group 11 are both disposed around a corresponding display area 101. In this way, as shown in FIG. 2, the first inorganic insulating layer 13 disposed on the side of the first barrier groups 11 away from the base substrate 10 is broken between the two first barriers 11 in each first barrier group 11, so that the first inorganic insulating layer 13 is separated into a plurality of first inorganic insulating sub-layers 131, and each first inorganic insulating sub-layer 131 is located in the corresponding display area 101 and a region where a first barrier 111, closer to the display area, of the first barrier group corresponding to the display area 101 is located. In other words, each display area corresponds to a first inorganic insulating sub-layer 131.

Shapes of orthogonal projections of the two first barriers 111 of each first barrier group 11 on the base substrate 10 are not limited in the embodiments of the present disclosure, as long as the shapes are all closed-shape and the two first barriers 111 are disposed around the display area.

In some examples, the shapes of the orthogonal projection of first barriers 111 of the plurality of first barrier groups 11 on the base substrate 10 are the same. For example, each of the shapes of the orthogonal projections of the two first barriers of each first barrier group 11 is a closed rectangular ring, a circular ring, or an irregular closed ring. FIG. 1 is illustrated by an example in which the shapes of the orthogonal projections of the two first barriers 111 of each first barrier group 11 on the base substrate 10 are both closed rectangular rings.

In some other examples, the shapes of the orthogonal projections of a plurality of first barriers 111 of the plurality of first barrier groups 11 on the base substrate 10 may not be exactly the same, which may be set based on requirements of display substrates in the display substrate motherboard.

Herein, the phrase "not exactly the same" means that some are the same and some are not the same, or all are not the same.

For example, shapes of orthogonal projections of two first barriers of a same first barrier group 11 on the base substrate 10 are the same, and shapes of orthogonal projections of first barriers 111 of different first barrier groups 11 on the base substrate 10 are different.

For another example, the shapes of the orthogonal projections of the two first barriers of each first barrier group 11 on the base substrate 10 are different. For example, the shape of the orthogonal projection of one first barrier of each first barrier group 11 on the base substrate 10 is a closed rectangular ring, and the shape of the orthographic projection of the other first barrier 111 on the base substrate 10 is a closed circular ring.

A size of each first barrier 111 is not limited in the embodiments of the present disclosure, and the size of the first barrier 111 may be set according to a usage of the display substrate. Sizes of the plurality of first barriers 111 may be exactly the same or not, as long as two first barriers 11 of the same first barrier group 11 may prevent a material filled therebetween for forming an inert material layer 12 from overflowing, that is, as long as an orthogonal projection of the inert material layer 12, disposed between the two first barriers 11 of the same first barrier group 11, on the base substrate 10 is non-overlapping with an orthogonal projection of any first barrier 111 on the base substrate 10.

For example, a dimension of the first barrier 111 in a thickness direction of the base substrate 10 is 0.5 μm to 5 μm, inclusive; and a dimension of the first barrier 111 in a direction perpendicular to the thickness direction of the base substrate 10 is 5 μm to 30 μm, inclusive.

As shown in FIG. 1, the two first barriers 111 of each first barrier group 11 are arranged at intervals. That is, the two first barriers of each first barrier group 11 have a first gap D1 therebetween, and a size of the first gap is not limited in the embodiments of the present disclosure. For example, the size of the first gap D1 between the two first barriers 111 of each first barrier group 11 is 20 μm to 300 μm, inclusive. For example, as shown in FIG. 1, sizes of first gaps each between two first barriers 111 of a first barrier group 11 are equal. Alternatively, sizes of first gaps each between two first barriers 111 of a different first barrier group 11 may not be exactly equal. In the embodiments of the present disclosure, the phrase "not be exactly equal" means that some are equal and some are not equal, or all are not equal.

In some examples, as shown in FIGS. 1 and 2, a first barrier, closest to a corresponding display area 101, of each first barrier group 11 and an edge of the display area 101 have a second gap D2 therebetween. A portion of the first inorganic insulating layer 13 is disposed in the second gap D2. A size of the second gap D2 is not limited in the embodiments of the present disclosure, as long as the portion of the first inorganic insulating layer 13 disposed on the second gap D2 may protect the light-emitting devices in the display substrate. That is, moisture and oxygen may be prevented from penetrating through the first barrier to intrude into the display substrate, and affecting the light-emitting devices.

For example, the size of the second gap D2 between the first barrier 111, closest to the display area 101, of each first barrier group 11 and the edge of the display area 101 is in a range of 15 μm to 300 μm, inclusive. For example, as shown in FIG. 1, sizes of second gaps each between a first barrier 111, closest to a corresponding display area 101, of the two first barriers 111 in each first barrier group 11 and an edge of the display area 101 are equal. Alternatively, sizes of second gaps each between a first barrier 111, closest to a corresponding display area 101, of a different first barrier group 11 and the edge of the display area 101 may not be exactly equal.

In some examples, as shown in FIG. 2, in the thickness direction of the base substrate 10, a minimum distance between a surface of the inert material layer 12 away from the base substrate 10 and the base substrate 10 is not greater than a maximum distance between a surface of the first barrier 111 away from the base substrate 10 and the base substrate 10.

In some embodiments, the material forming the inert material layer 12 is an organic material in which terminal groups are inert groups, and the material does not react with a material of the first inorganic insulating layer 13.

In some examples, a raw material of the inert material layer 12 is a first organic material. At normal temperature and normal pressure, the first organic material may undergo a hydrolysis reaction or an alcoholysis reaction with groups existing on the base substrate 10 or a film layer in contact with the surface of the first barrier 111 proximate to the base substrate 10, so as to generate the inert groups, thereby forming the inert material layer 12.

For example, the first organic material includes one of vinyltriethoxysilane, vinyltriacetoxysilane, and chloromethyltriethoxysilane.

Figure 4A:
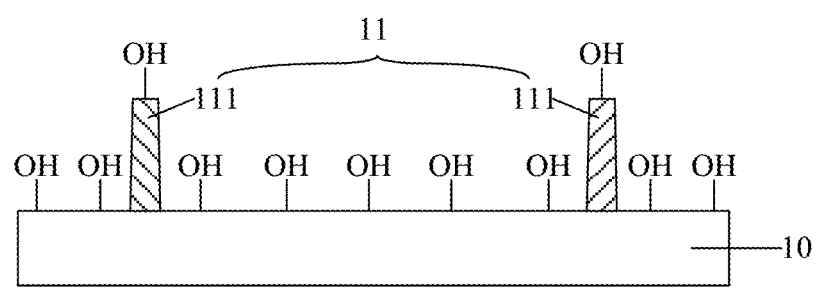
FIG. 4A is a schematic diagram showing a manufacturing process of an inert material layer, in accordance with some embodiments.
Figure 4B:
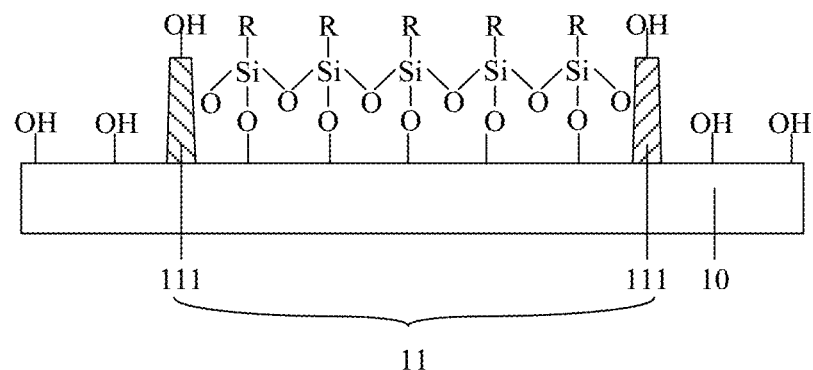
FIG. 4B is a schematic diagram showing a manufacturing process of an inert material layer, in accordance with some embodiments.

Considering an example in which a formula of the first organic material is RSi-(OEt)$_3$, where R represents a substituent, as shown in FIGS. 4A and 4B, the first organic material is filled between the two first barriers 111 of the first barrier group 11, and the group (OEt)$_3$, connected to the silicon (Si), in the formula of the first organic material may undergo the hydrolysis reaction with the groups —OH existing on the base substrate 10 to generate the inert groups

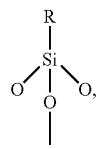

thereby forming the inert material layer 12.

The reaction process may be expressed as:

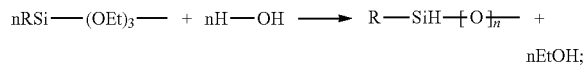

nEtOH;

where Et represents an ethyl group.

Herein, the groups —OH existing on the base substrate 10 come from the moisture during a manufacturing of the display substrate, or a surface of the base substrate 10 proximate to the first barrier 111 is pre-treated to have the active groups —OH. The groups —OH existing on the film layer in contact with the surface of the first barrier 111 proximate to the base substrate 10 come from the moisture during a manufacturing of the film layer, or a surface of the film layer away from the base substrate 10 is pre-processed to have the active groups —OH.

In some examples, the material of the inert material layer 12 is a second organic material, and terminal groups of the second organic material are all inert groups.

For example, the second organic material includes one of a polystyrene-based material (e.g., polystyrene or polymethylstyrene), a polyethylene oxides-based material (e.g., polyethylene oxide or polypropylene oxide), a polymethyl methacrylate-based material (e.g., polymethyl methacrylate or polybutyl methacrylate) and a polyvinylpyrrolidone-based material (e.g., polyvinyl chloride or polyvinylpyrrolidone).

Figure 5A:
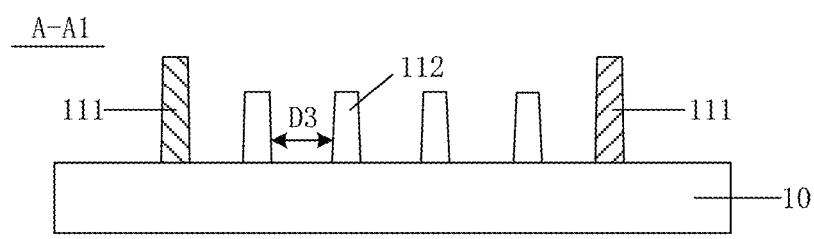
FIG. 5A is a sectional view showing yet another structure taken along the line A-A1 of the display substrate in FIG. 1, in accordance with some embodiments.
Figure 5B:
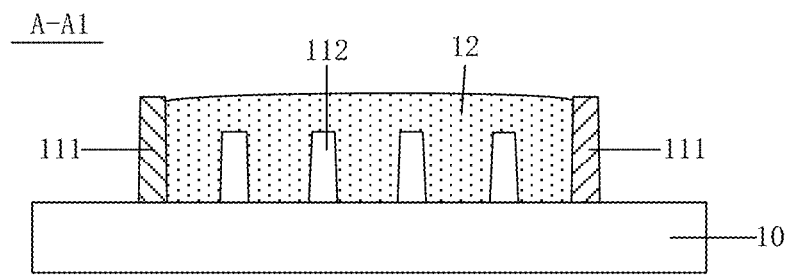
FIG. 5B is a sectional view showing yet another structure taken along the line A-A1 of the display substrate in FIG. 1, in accordance with some embodiments.

In some embodiments, as shown in FIGS. 5A and 5B, the display substrate motherboard may further include at least one sub-barrier 112. At least one sub-barrier 112 is located in a region between two first barriers 111 of at least one first barrier group 11. The at least one sub-barrier 112 and the two first barriers 111 are disposed in a same layer, and the inert material layer 12 covers each sub-barrier 112.

In some examples, at least one sub-barrier 112 is provided between the two first barriers 111 of each first barrier group 11.

In some other examples, at least one sub-barrier 112 is provided between the two first barriers 111 of each of some first barrier groups 11.

In some examples, there is one sub-barrier 112 between the two first barriers 111 of the first barrier group 11. In some other examples, as shown in FIGS. 5A and 5B, there are a plurality of sub-barriers 112 between the two first barriers 111 of the first barrier group 11, and the plurality of sub-barriers 112 arranged at interval.

A size of the sub-barrier 112 is not limited in the embodiments of the present disclosure, which may be set according to actual conditions. In a case where there are a plurality of sub-barriers 112, the sizes of the plurality sub-barriers 112 may be exactly the same, or may not be exactly the same.

In the embodiments of the present disclosure, a dimension of the sub-barrier 112 in the thickness direction of the base substrate 10 and a dimension of the sub-barrier 112 in a direction perpendicular to the thickness direction of the base substrate 10 have no association relationship with corresponding dimensions of the first barrier 111.

In some examples, the dimension of the sub-barrier 112 in the thickness direction of the base substrate 10 is less than or equal to the dimension of the first barrier 111 in the thickness direction of the base substrate 10. In this way, an influence of the sub-barrier 112 on an overall thickness of the display substrate may be avoided.

For example, the dimension of the first barrier 112 in the thickness direction of the base substrate 10 is in a range of 0.5 µm to 2.5 µm, inclusive; and the dimension of the first barrier 112 in the direction perpendicular to the thickness direction of the base substrate 10 is in a range of 5 µm to 15 µm, inclusive.

In the case where the plurality of sub-barriers 112 are provided between the two first barriers of the first barrier group 11, as shown in FIG. 5A, a size of a third gap D3 between two adjacent sub-barriers 112 is not limited in the embodiments of the present disclosure. For example, the size of the third gap D3 between the two sub-barriers 112 is in a range of 5 µm to 15 µm, inclusive.

In the embodiments of the present disclosure, by arranging sub-barrier(s) 112 between two first barriers 111 of a first barrier group 11, the overflow of the material for forming the inert material 12 may be further avoided, and furthermore, a stability of the inert material layer 12 in the display substrate may be increased.

Figure 6A:
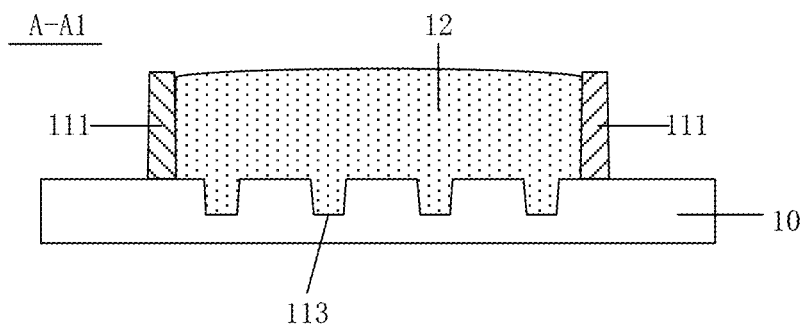
FIG. 6A is a sectional view showing yet another structure taken along the line A-A1 of the display substrate in FIG. 1, in accordance with some embodiments.
Figure 6B:
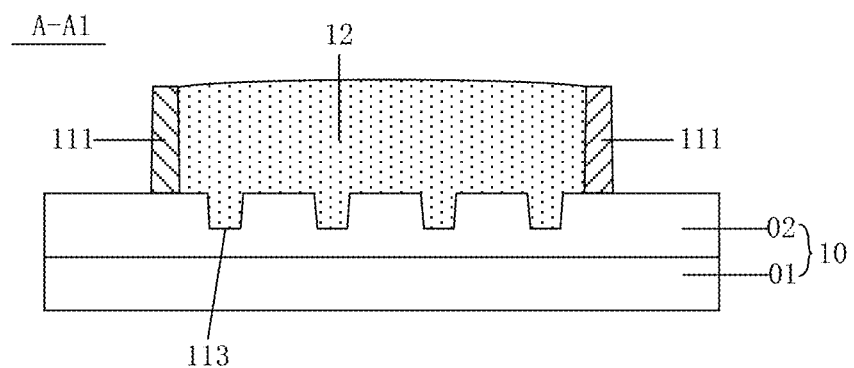
FIG. 6B is a sectional view showing yet another structure taken along the line A-A1 of the display substrate in FIG. 1, in accordance with some embodiments.
Figure 6C:
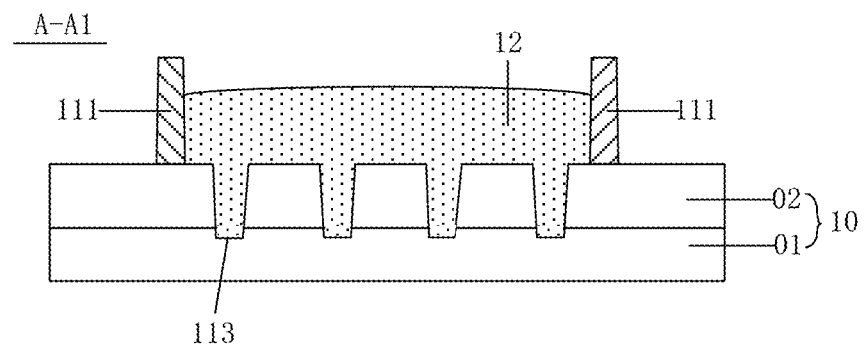
FIG. 6C is a sectional view showing yet another structure taken along the line A-A1 of the display substrate in FIG. 1, in accordance with some embodiments.

In the embodiments of the present disclosure, a plurality of first barriers 111 and a plurality of sub-barriers 112 with different heights may be fabricated by using a halftone mask. In some embodiments, as shown in FIG. 6A, the first barrier group 11 is disposed on the surface of the base substrate 10. The surface of the base substrate 10 proximate to the first barrier group 11 has at least one groove 113. At least one groove 113 is located in a region between two first barriers 111 of a first barrier group 11, and the inert material layer 12 covers the at least one groove 113. In some examples, as shown in FIG. 6B, the base substrate 10 includes a base 01 and a buffer layer 02, disposed between the base 01 and the first barriers 111, that are stacked. Based on this, as an example, the groove 113 is provided in a surface of the buffer layer 02 in contact with the first barriers 111. As another example, as shown in FIG. 6C, the groove 113 penetrates the buffer layer 02 and is disposed in the surface of the base 01. In some examples, a material of the base 01 is, for example, glass or polyimide (PI). A material of the buffer layer 02 is, for example, silicon nitride ($SiN_x$), silicon oxide ($SiO_x$) or aluminum oxide ($Al_2O_3$).

Figure 6D:
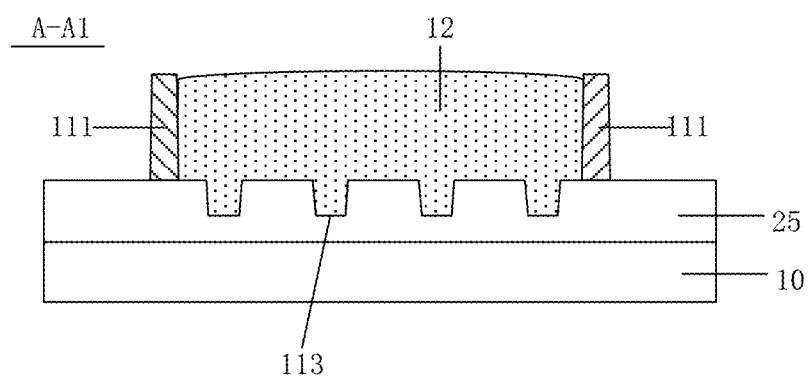
FIG. 6D is a sectional view showing yet another structure taken along the line A-A1 of the display substrate in FIG. 1, in accordance with some embodiments.

In some embodiments, as shown in FIG. 6D, the display substrate motherboard 100 further includes a dielectric layer 25 disposed between the base substrate 10 and the first barrier group 11. The first barrier group 11 is disposed on a surface of dielectric layer 25 away from the base substrate 10, and the surface of the dielectric layer 25 away from the base substrate 10 has at least one groove 113. Herein, the dielectric layer 25 is the above film layer that is in contact with the surface of the first barrier 111 proximate to the base substrate 10.

For example, the dielectric layer 25 is a gate insulating layer. A material of the gate insulating layer may be, for example, one of silicon oxide, silicon nitride, and silicon oxynitride.

For another example, the dielectric layer 25 is an interlayer dielectric layer. A material of the interlayer dielectric layer is, for example, any one of polybenzobisoxazole, photosensitive polyimide, benzocyclobutene, or inorganic materials. In some examples, a portion of a surface located between the two first barriers 111 of each first barrier group 11 of the base substrate 10 or a portion of a surface, away from the base substrate 10, located between the two first barriers 111 of each first barrier group 11 of the dielectric layer 25 is provided with at least one groove 113 therein.

In some other examples, a portion of a surface located between the two first barriers 111 of each of some first barrier groups 11 of the base substrate 10 or a portion of the surface located between the two first barriers 111 of each of some first barrier groups 11 of the dielectric layer 25 is provided with at least one groove 113 therein.

For example, there is one groove 113 in the portion of the surface located between the two first barriers 111 of the first barrier group 11 of the base substrate 10, or the portion of the surface located between the two first barriers 111 of the first barrier group 11 of the dielectric layer 25.

For another example, there are a plurality of grooves 113 in the portion of the surface located between the two first barriers 111 of each first barrier group 11 of the base substrate 10, or the portion of the surface located between the two first barriers 111 of the first barrier group 11 of the dielectric layer 25, and the plurality of grooves 113 are arranged at intervals. A size of the groove(s) 113 is not limited in the embodiments of the present disclosure, which may be set according to actual conditions. In a case where there are a plurality of grooves 113, the sizes of the plurality grooves 113 may be exactly the same, or may not be exactly the same.

For example, a dimension of the groove 113 in the thickness direction of the base substrate 10 is in a range of 0.5 μm to 2.5 μm, inclusive.

For another example, a dimension of the groove 113 in the direction perpendicular to the thickness direction of the base substrate 10 is in a range of 5 μm to 15 μm, inclusive.

In a case where there are a plurality of grooves 113 in the portion of the surface located between the two first barriers 111 of the same first barrier group 11 of the base substrate 10 or the portion of the surface located between the two first barriers 111 of the same first barrier group 11 of the dielectric layer 25, a size of a fourth gap between two adjacent grooves 113 is not limited in the embodiments of the present disclosure. For example, the size of the fourth gap between the two adjacent grooves 113 is in a range of 5 μm to 15 μm, inclusive.

In the embodiments of the present disclosure, by forming the groove(s) 113 in the portion of the surface located between the two first barriers 111 of the first barrier group 11 of the base substrate 10 or the portion of the surface located between the two first barriers 111 of the first barrier group 11 of the dielectric layer 25, the overflow of the material for forming the inert material 12 may be further avoided, and furthermore, a stability of the inert material layer 12 on the display substrate may be increased. In some embodiments, the groove(s) 113 may be formed by a dry etching process.

In some embodiments, as shown in FIG. 3, the display substrate motherboard 100 further includes an organic encapsulation layer 132 disposed between the first inorganic encapsulation layer 132 and the second inorganic encapsulation layer 133. The organic encapsulation layer 134 is located in the plurality of display areas 101. The organic encapsulation layer 134 may prevent inorganic particles in the first inorganic encapsulation layer 132 from affecting a manufacturing of the second inorganic encapsulation layer 133, and prevent the second inorganic encapsulation layer 133 from cracking. That is, the organic encapsulation layer 134 has a planarization effect on the first inorganic encapsulation layer. For example, a material of the organic encapsulation layer 134 is, for example, acrylic.

Figure 7:
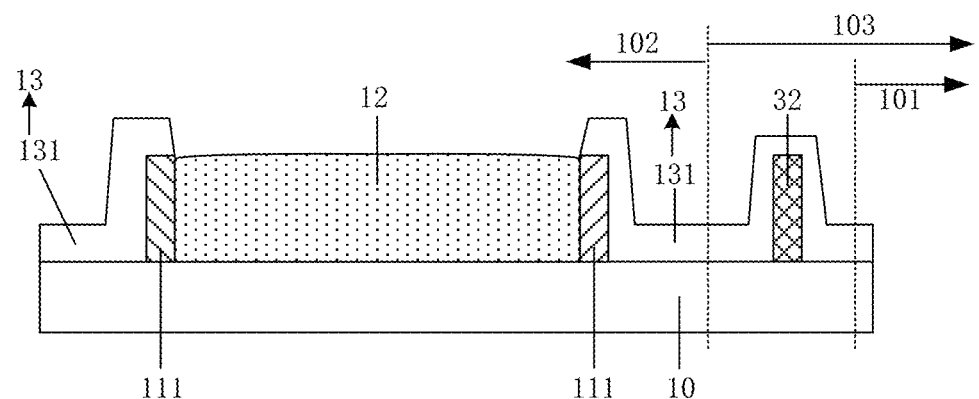
FIG. 7 is a sectional view showing yet another structure taken along the line A-A1 of the display substrate in FIG. 1, in accordance with some embodiments.

In some embodiments, as shown in FIGS. 3 and 7, the display substrate motherboard 100 further includes a plurality of barrier dams 32 disposed on the base substrate 10. At least one barrier dam 32 is disposed at a side of the first barrier group 11 proximate to a corresponding display area 101, and each barrier dam 32 is disposed around the display area 101. Since the organic material of the organic encapsulation layer 134 has a certain fluidity, the barrier dam(s) 32 may prevent the organic material of the organic encapsulation layer 134 from overflowing. In some examples, each display area 101 is surrounded by at least one barrier dam 32.

For example, each display area 101 is surrounded by one barrier dam 32.

For another example, each display area 101 is surrounded by a plurality of barrier dams 32, and the plurality of barrier dams 32 may be connected end to end or not connected, as long as the plurality of barrier dams 32 are combined to surround the display area 101.

For yet another example, some of the plurality of display areas 101 are each surrounded by one barrier dam 32, and some display areas 101 are each surrounded by a combination of a plurality of barrier dams 32. The embodiments of the present disclosure does not limit thereto, it may be set according to requirements of each display substrate of the display substrate motherboard 100.

Figure 8:
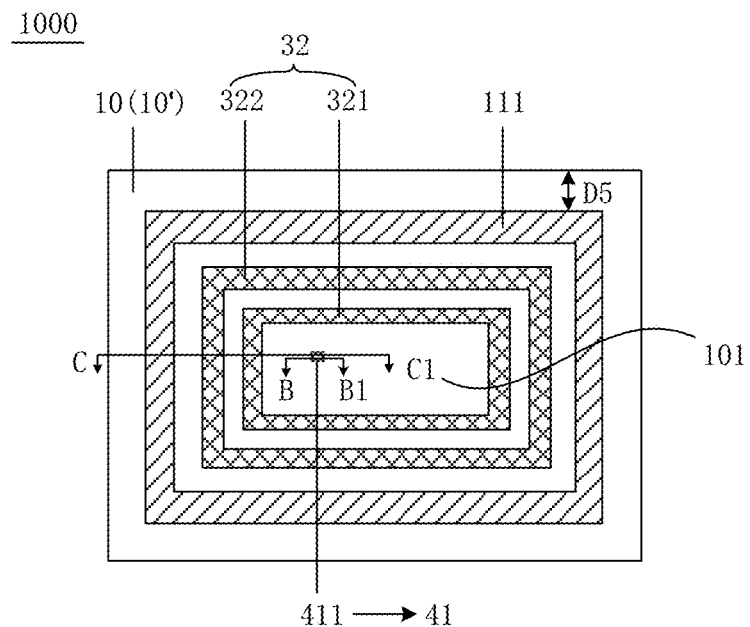
FIG. 8 is a schematic top view of a display substrate, in accordance with some embodiments.

In some examples, as shown in FIGS. 3 and 8, at least one barrier dam 32 corresponding to each display area 101 includes a first barrier dam 321 and a second barrier dam 322. The second barrier dam 322 and the first barrier dam 321 are arranged at intervals in the direction perpendicular to the thickness of the base substrate 10. The first barrier dam 321 is disposed around the display area 101, and the second barrier dam 322 is disposed around the first barrier dam 321.

As shown in FIG. 3, in the thickness direction of the base substrate 10, a minimum distance from a surface of the second barrier dam 322 away from the base substrate 10 to the base substrate 10 is greater than a minimum distance from a surface of the first barrier dam away from the base substrate 10 to the base substrate 10. Alternatively, in the thickness direction of the base substrate 10, the minimum distance from the surface of the second barrier dam 322 away from the base substrate 10 to the base substrate 10 may be less than or equal to the minimum distance from the surface of the first barrier dam away from the base substrate 10 to the base substrate 10. The embodiments of the present disclosure does not limit thereto, as long as the first barrier dam 321 and the second barrier dam 322 are arranged at intervals.

For example, the first barrier dam 321 and the second barrier dam 322 are both disposed on the surface of the dielectric layer 25. Herein, the first barrier dam 321 and the second barrier dam 322 with different heights may be manufactured by using a halftone mask.

For example, the first barrier dam 321, the second barrier dam 322 and the pixel defining layer are disposed in a same layer. That is to say, the first barrier dam 321, the second barrier dam 322, and the pixel defining layer may be formed by masking, exposing, etching, and other processes based on a same film layer. In this way, the manufacturing process of the display substrate is simplified.

For another example, the first barrier dam 321 is disposed on the surface of the dielectric layer 25. Other film layer(s) are provided on the surface of the dielectric layer at a position corresponding to the second barrier dam 322, and the second barrier dam 322 is disposed on a surface of the other film layer(s) away from the the base substrate 10. Therefore, the height of the first barrier dam 321 is less than the height of the second barrier dam 322. Herein, the height of the first barrier dam 321 is the minimum distance from the surface of the first barrier dam 321 away from the base substrate 10 to the base substrate 10 in the thickness direction of the base substrate 10; and the height of the second barrier dam 322 is the minimum distance from the surface of the second barrier dam 322 away from the base substrate 10 to the base substrate 10 in the thickness direction of the base substrate 10.

In this way, an arrangement of the second barrier dam 322 arranged at interval from the first barrier dam 321 may further prevent the organic encapsulation layer from overflowing the barrier dam 32. The material of the organic encapsulation layer overflowing the first barrier dam 321 may flow into a region between the adjacent first barrier dam 321 and the second barrier dam 322. A material of the barrier dam(s) 32 is not limited in the embodiments of the present disclosure, and the material of the barrier dam(s) 32 is determined according to a forming process of the barrier dam(s) 32. For example, if the barrier dam(s) 32 and the pixel defining layer are formed synchronously, the material of the barrier dam(s) 32 and the material of the pixel defining layer are a same material.

Figure 9:
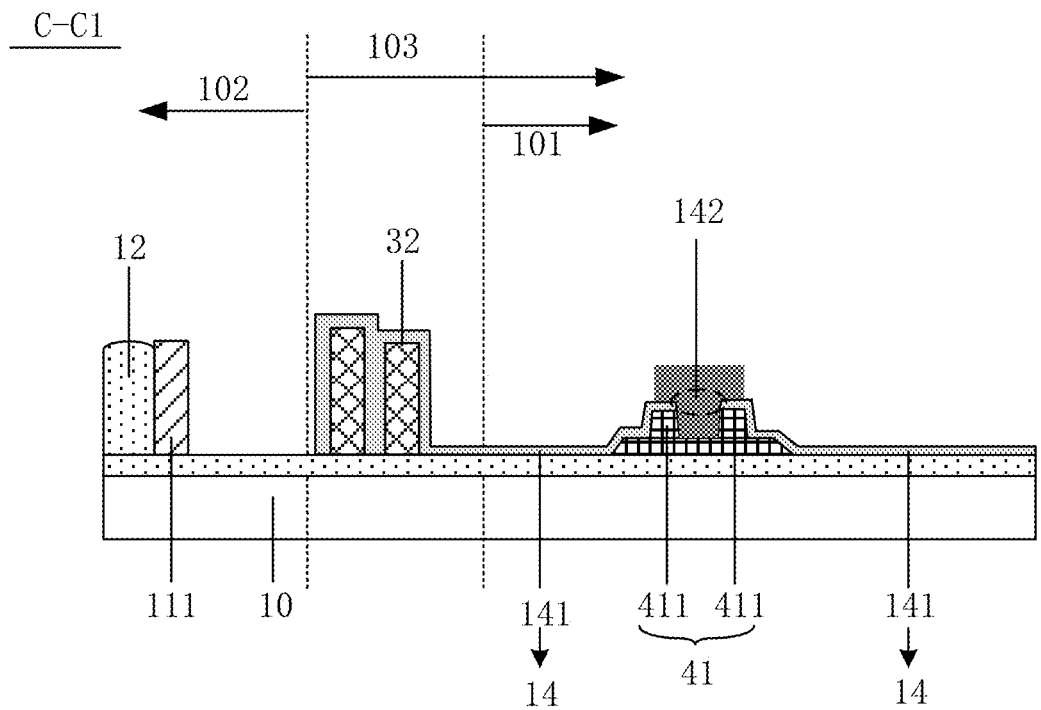
FIG. 9 is a sectional view showing a structure taken along the line C-C1 of the display substrate in FIG. 8, in accordance with some embodiments.

In some embodiments, as shown in FIGS. 8 and 9, the display substrate motherboard 100 further includes a plurality of second barrier groups 41 disposed on the base substrate 10. Orthogonal projections of the plurality of second barrier groups 41 on the base substrate 10 are non-overlapping with orthogonal projections of the plurality of first barrier groups 31 on the base substrate 10. Each second barrier group 41 includes at least two adjacent second barriers 411, and at least two adjacent second barriers 411 has a gap region therebetween.

As shown in FIG. 9, the display substrate motherboard 100 further includes a second inorganic insulating layer 14 disposed on a side of the second barrier groups 41 away from the base substrate 10, and at least one via hole 142 in the second inorganic insulating layers 14. An orthogonal projection of the gap region on the base substrate 10 is overlapping with an orthogonal projection of a via hole 142 on the base substrate 10.

In some examples, each second barrier group 41 includes two second barriers 411, and the two second barriers 411 have a gap region therebetween. Herein, shapes of orthogonal projections of the two second barriers 411 on the base substrate 10 are each a block. For example, the shapes of the orthogonal projections of the two second barriers 411 on the base substrate 10 are the same. For another example, the shapes of the orthogonal projections of the two second barriers 411 on the base substrate 10 are different. The number of the second barriers 411 of each second barrier group 41 and the shape of the orthogonal projection of each second barrier on the base substrate 10 are not limited in the embodiments of the present disclosure, as long as the at least two adjacent second barriers 411 of each second barrier group 41 may have the gap region therebetween.

In some examples, each second barrier group 41 has the same number of the second barriers 411 and has the same shape of the orthogonal projection on the base substrate 10.

In some other examples, the numbers of second barriers 411 of the second barrier groups 41 are not exactly equal, and the shapes of the orthogonal projections of the second barriers 411 on the base substrate 10 are not exactly the same.

For example, the second barrier group 41 includes a plurality of second barriers 411, and the plurality of second barriers 411 are connected end to end to form a closed shape with a gap region in the middle. For example, as shown in FIG. 8, the second barrier group 41 includes four second barriers 411, and a shape of an orthogonal projection of each second barrier 411 on the base substrate 10 is a long strip. The four second barriers 411 are connected end to end to form a closed rectangular ring with a gap region with in the middle. Alternatively, the second barriers 411 may form a circular ring shape, which is not limited in the embodiments of the present disclosure.

For another example, the second barrier group 41 includes two second barriers 411, and the two second barriers 411 are arranged at intervals. A shape of an orthogonal projection of each second barrier 411 on the base substrate 10 is a rectangle, and the two second barriers 411 have a gap region therebetween.

In this way, when an inert organic film layer is formed in the gap region, and then an inorganic insulating film is deposited on a side of the second barrier groups 41 away from the base substrate 10, the inorganic insulating film cannot be attached to the inert organic film layer since the inorganic insulating film does not chemically react with the inert organic film layer, so that a via hole 142 is formed in the gap region in the second inorganic insulating layer 14 (as shown in FIG. 9).

Figure 15:
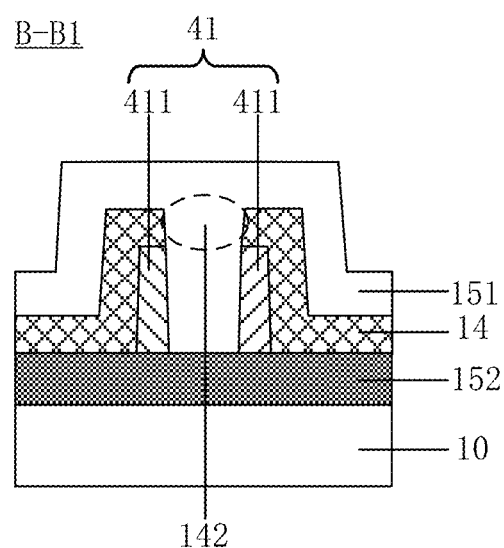
FIG. 15 is a sectional view showing another structure taken along the line B-B1 of the display substrate in FIG. 8, in accordance with some embodiments.

Based on this, as shown in FIG. 15, an electrically connection of a first conductive layer 151, disposed on a side of the second inorganic insulating layer 14 away from the base substrate 10, and a second conductive layer 152, disposed on a side of the second inorganic insulating layer 14 proximate to the base substrate 10, may be achieved through a via hole 142 in the second inorganic insulating layer 14.

In some examples, the inert organic film layer may be formed by the first organic material or the second organic material above mentioned, and a manufacturing process thereof is the same as the above, and details will not be repeated herein.

Figure 10:
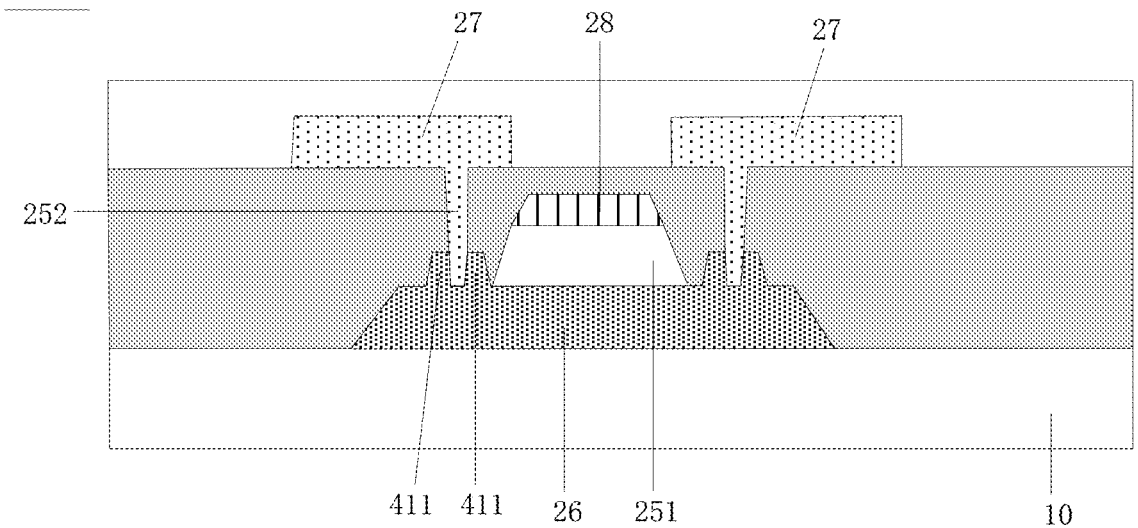
FIG. 10 is a sectional view showing a structure taken along the line B-B1 of the display substrate in FIG. 8, in accordance with some embodiments.

In some embodiments, as shown in FIG. 10, the display substrate motherboard 100 further includes an active layer 26 disposed on the base substrate. A gate insulating pattern 251 is disposed on a side of the active layer 26 away from the base substrate 10. The display substrate motherboard 100 further includes a source-drain metal layer 27 disposed on a side of the interlayer dielectric layer 252 away from the base substrate 10, and a gate 28 disposed between the gate insulating layer 251 and the interlayer dielectric layer 252.

Based on this, a second barrier group 41 is disposed in a display area 101, and the second barrier group 41 may be disposed in a same layer as the active layer 26. That is, each second barrier 411 of the second barrier group 41 and the active layer 26 may formed by a same patterning process. For example, a material of the active layer 26 includes polysilicon (p-Si). Herein, in a region where the second barrier 411 is provided, the active layer 26 and the second barrier 411 with different heights may be fabricated by a halftone mask.

In this way, when the interlayer dielectric layer 252 is deposited on the side of the second barrier 411 away from the base substrate, via holes may be formed in the interlayer dielectric layer 252, so that the source-drain metal layer 27 (e.g., the above first conductive layer 151) disposed on the side of the interlayer dielectric layer 252 away from the base substrate 10 may be electrically connected to the active layer 26 (e.g., the above second conductive layer 152) through via holes 142.

Herein, the second inorganic insulating layer 14 may include the above interlayer dielectric layer 252.

Alternatively, the second inorganic insulating layer may include other film in the display substrate motherboard.

A position of the second barrier group 41 in the display substrate motherboard is not limited in the present disclosure, which may be set according to the requirements of each display substrate and requirements of the via holes in the second inorganic insulating layer 14 in the display substrate.

In the embodiments of the present disclosure, as shown in FIG. 9, after the display substrate motherboard 100 is cut along the cutting line(s) in the cutting area 102, the second inorganic insulating layer 14 is separated into a plurality of second inorganic insulating sub-layers 141, and each display area 101 corresponds to a second inorganic insulating sub-layer 141.

As shown in FIG. 8, some embodiments of the present disclosure provide a display substrate 1000, which includes a portion obtained by cutting along the cutting line(s) in the cutting area 102 of the display substrate motherboard 100 of any one of the above embodiments. In the embodiments of the present disclosure, the display motherboard 100 may be cut by using a laser cutting process. Structures of a plurality of display substrates 1000 obtained by cutting may be exactly the same or not, which depends on a manufacturing process of the display substrate motherboard 100.

In some embodiments, as shown in FIG. 8, the display substrate 1000 has a display area 101. The display substrate 1000 includes a base sub-substrate 10' (i.e., a part of the base substrate 10 after cutting), and first barrier(s) 111 disposed on the base sub-substrate 10'. A first barrier 111 is located at least one side of the display area 101, and at any side of the display area 101 where the first barrier 111 is provided, the first barrier 111 and an edge of the base sub-substrate 10' have a fifth gap D5 therebetween.

In some examples, as shown in FIG. 8, at different sides of the display area 101 where the first barrier 111 is provided, sizes of fifth gaps D5 each between the first barrier 111 and an edge of the base sub-substrate 10' are equal.

In some other examples, at different sides of the display area 101 where the first barrier 111 is provided, sizes of fifth gaps each between the first barrier 111 and an edge of the base sub-substrate 10' are not exactly equal.

Herein, at the different sides of the display area 101 where the first barrier 111 is provided, a size of a fifth gap between the first barrier 111 and an edge of the base sub-substrate 10' depends on a distance between a cutting line located at a corresponding side of the display area 101 and the first barrier 111.

The display substrate 1000 further includes an inert material pattern 12' (i.e., a part of the inert material layer 12 after cutting) disposed between the first barrier 111 and the edge of the base sub-substrate 10', and a first inorganic insulating sub-layer 131 disposed on a side of the first barrier 111 away from the base sub-substrate 10', and the first inorganic insulating sub-layer 131 is further located in the display area 101. At any side of the display area 101 where the first barrier 111 is provided, an orthogonal projection of an edge of the first inorganic insulating sub-layer 131 on the base sub-substrate 10' is located within a range of an orthogonal projection of the first barrier 111 on the base sub-substrate 10'.

In some embodiments, as shown in FIG. 8, the first barrier 111 is arranged around the display area 101. Orthogonal projections of edges of the first inorganic insulating sub-layer 131 on the base sub-substrate 10' are located within the range of the orthogonal projection of the first barrier 111 on the base sub-substrate 10'.

In some embodiments, the display substrate 1000 is an organic light-emitting diode (OLED) display substrate.

In some other embodiments, the display substrate 1000 is a quantum dot light-emitting diode (QLED) display substrate. Alternatively, the display substrate 1000 may be other types of display substrates, and the embodiments of the present disclosure does not limit thereto, and a structure of the display substrate may be adjusted according to a usage of the display substrate. In some embodiments, as shown in FIG. 3, the display substrate 1000 further includes a plurality of light-emitting devices 23 and a pixel driving circuit electrically connected to each light-emitting device 23.

In some examples, each pixel driving circuit includes at least a driving transistor, a switching transistor and a storage capacitor.

In some examples, as shown in FIG. 3, each light-emitting device 23 includes a first electrode 231, a light-emitting functional layer 232, and a second electrode 233 that are stacked. For example, the first electrode 231 is an anode, and the second electrode 233 is a cathode. For another example, the first electrode 231 is a cathode, and the second electrode 233 is an anode.

A pixel defining layer 24 of the display substrate 1000 has a plurality of openings, and each light-emitting device 23 is arranged corresponding to an opening.

In some embodiments, the light-emitting functional layer 232 is an oraganic light-emitting functional layer.

In some other embodiments, the light-emitting functional layer 232 is a quantum dot light-emitting functional layer.

Figure 11:
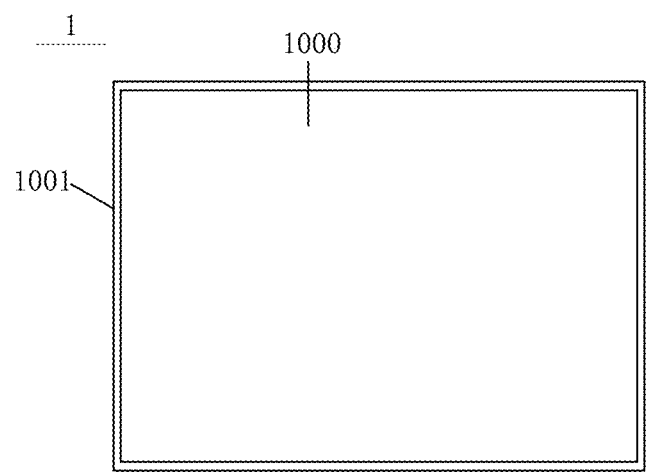
FIG. 11 is a schematic top view of a display apparatus, in accordance with some embodiments.

As shown in FIG. 11, some embodiments of the disclosure provide a display apparatus 1 including the display substrate 1000 provided by any one of the above embodiments. The display apparatus 1 may serve as any product or component with a display function such as a display, a television, a digital camera, a mobile phone, a tablet computer, an augmented reality (AR) product or a virtual reality (VR) product, and use of the display apparatus 1 is not limited in the embodiments of the present disclosure.

In some embodiments, as shown in FIG. 11, the display apparatus 1 includes the display substrate 1000, a frame 1001, a cover plate, a circuit board and the like. The display apparatus 1 may include more or fewer components, and relative positions of these components may be changed.

In some examples, the circuit board is configured to provide the display substrate 1000 with signals required for display. For example, the circuit board is a printed circuit board assembly (PCBA), and the PCBA includes a printed circuit board (PCB), and a timing controller (TCON), a power management integrated circuit (PMIC), and other ICs or circuitry that are disposed on the PCB.

The display apparatus has the same technical effects as those of the display substrate described above, and details are not described herein again.

Figure 12:
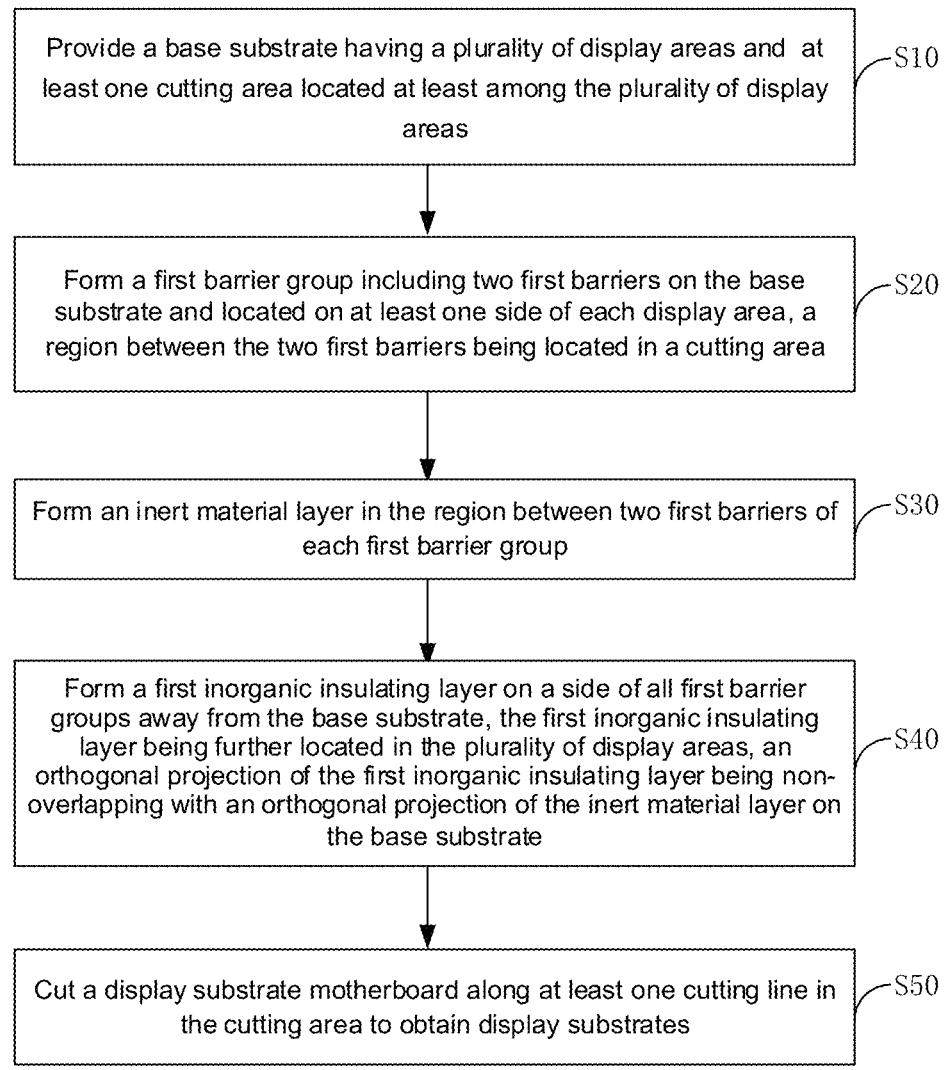
FIG. 12 is a flow chart of a manufacturing method for a display substrate, in accordance with some embodiments.

Some embodiments of the present disclosure provide a manufacturing method for a display substrate. As shown in FIG. 12, the method includes S10 to S50.

In S10, a base substrate 10 is provided. The base substrate 10 has a plurality of display areas 101, a plurality of display substrate areas 103, and cutting area(s) 102 located outside of the plurality of display areas 101. A display area 101 is located in a corresponding display substrate area 103, and the cutting area(s) 102 and the display substrate areas 103 are non-overlapping with each other.

Figure 13:
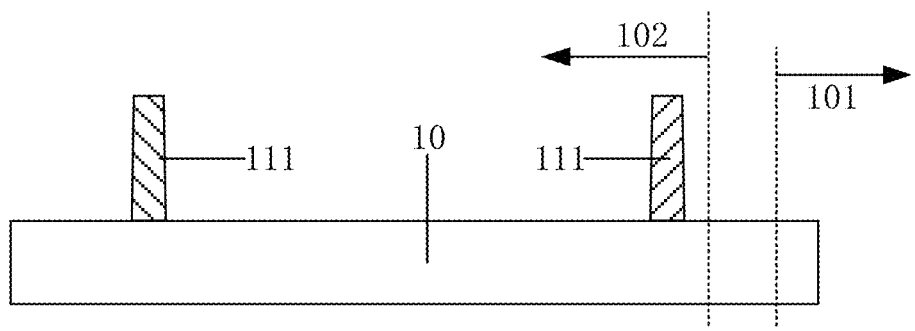
FIG. 13 is a schematic diagram showing a manufacturing process of a display substrate, in accordance with some embodiments.

In S20, as shown in FIG. 13, a first barrier group 11 including two first barriers 111 is formed on the base substrate 10 and on at least one side of each display area 101. Moreover, a region between the first barriers 111 of each first barrier group 11 is located in a cutting area 102 corresponding to the first barrier group 11.

In some embodiments, a plurality of first barriers 111 and a planarization layer 22 are formed by a same patterning process.

In some other embodiments, a plurality of first barriers 111 and a pixel defining layer 24 are formed by a same patterning process.

Figure 14A:
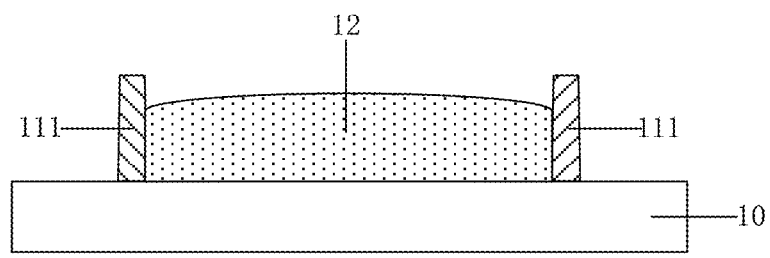
FIG. 14A is a schematic diagram showing a manufacturing process of another display substrate, in accordance with some embodiments.
Figure 14B:
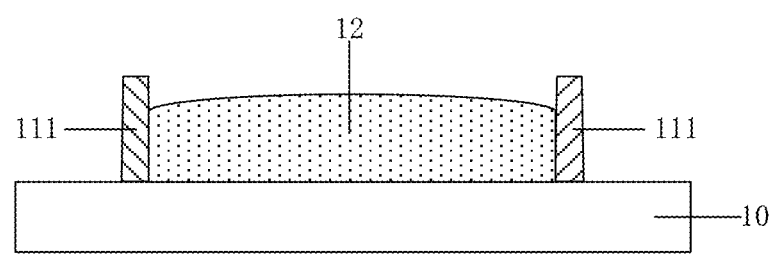
FIG. 14B is a schematic diagram showing a manufacturing process of yet another display substrate, in accordance with some embodiments.

In S30, as shown in FIGS. 14A and 14B, an inert material layer 12 is formed in the region between the two first barriers 111 of each first barrier group 11.

In some embodiments, S30 includes S302.

In S302, the region between the two first barriers 11 of each first barrier group 11 is filled with a first organic material to form the inert material layer 12.

A process of filling the region between the two first barriers 11 of each first barrier group 11 with the first organic material is not limited in the embodiments of the present disclosure, as long as the first organic material is filled only into the region between the two first barriers 11 of each first barrier group 11.

For example, the region between the two first barriers 11 of each first barrier group 11 is filled with the first organic material by using an inkjet printing process, and then a baking and curing process are performed on the first organic material.

In some embodiments, the first barrier group 11 is located on the surface of the base substrate 10. Based on this, before S302, S30 further includes S301.

In S301, the surface of the base substrate 10 is pre-treated to have hydroxyl groups, so that after the region is filled with the first organic material, the first organic material undergoes a hydrolysis reaction or an alcoholysis reaction with the hydroxyl groups to form the inert material layer 12.

A process for pre-processing the surface of the base substrate 10 is not limited in the embodiments of the present disclosure, as long as the process may achieve that the surface of the base substrate 10 has the hydroxyl groups.

For example, a plasma surface treatment method is used to pre-treat the surface of the base substrate 10, so that the surface of the base substrate 10 has the active hydroxyl groups.

For another example, an ultraviolet irradiation method is used to pre-treat the surface of the base substrate 10, so that the surface of the base substrate 10 has the active hydroxyl groups.

In some embodiments, before S20, the manufacturing method for the display substrate further includes S11.

In S11, a dielectric layer 25 is formed on the base substrate 10.

For example, a gate insulating layer is formed on the base substrate 10.

For another example, an interlayer dielectric layer is formed on the base substrate.

Based on this, before S302, S30 further includes S301'.

In S301', the surface of the dielectric layer 25 is pre-treated to have hydroxyl groups, so that after the region is filled with the first organic material, the first organic material reacts with the hydroxyl groups to form the inert material layer 12.

Herein, a process of pre-treating a surface of the dielectric layer 25 away from the base substrate 10 is the same as the process of pre-treating the surface of the base substrate 10 in S301. For example, the process of pre-treating the surface of the dielectric layer 25 away from the base substrate 10 may also employ a plasma surface treatment method or an ultraviolet light irradiation method. For example, a plasma surface treatment method is used to pre-treat the surface of the dielectric layer 25 away from the base substrate 10, so that the surface of the dielectric layer 25 away from the base substrate 10 has the active hydroxyl groups.

For another example, an ultraviolet irradiation method is used to pre-treat the surface of the dielectric layer 25 away from the base substrate 10, so that the surface of the dielectric layer 25 away from the base substrate 10 has the active hydroxyl groups.

In some embodiments, S30 includes S302'.

In S302', the region between two first barriers 11 of each first barrier group 11 is filled with a second organic material to form the inert material layer 12.

In S40, as shown in FIG. 2, a first inorganic insulating layer 13 is formed on a side of a plurality of first barrier groups 11 away from the base substrate 10, so that a display substrate motherboard is obtained.

A process of forming the first inorganic insulating layer 13 is not limited in the embodiments of the present disclosure.

In some examples, the first inorganic insulating layer 13 is formed by using a chemical vapor deposition (CVD) process.

In some other examples, the first inorganic insulating layer 13 is formed by using to an atomic layer deposition (ALD) process.

Figure 4C:
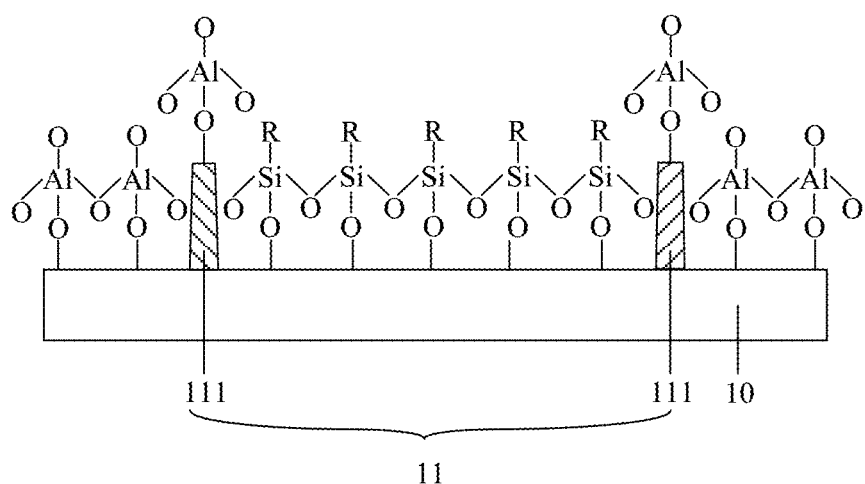
FIG. 4C is a schematic diagram showing a process of forming a first inorganic insulating layer on a side of an inert material layer away from a base substrate, in accordance with some embodiments.

As shown in FIG. 4C, considering an example in which a material of the first inorganic insulating layer 13 includes $Al_2O_3$, a process of forming the first inorganic insulating layer 13 on the side of the first barrier groups 11 away from the base substrate 10 includes as follows.

The base substrate 10 is placed in a vacuum apparatus, and a precursor (trimethylaluminum) of $Al_2O_3$ is input into the vacuum apparatus, so that the precursor (trimethylaluminum) of $Al_2O_3$ is deposited on the base substrate. Since The material of the inert material layer 12 is an inert organic material, in this case, when the first inorganic insulating layer 13 is deposited on the side of the first barrier groups 11 away from the base substrate 10, the precursor (trimethylaluminum) of $Al_2O_3$ does not chemically react with the inert organic material, therefore, the precursor (trimethylaluminum) cannot be attached to the inert material layer 12.

Thereafter, a gas in the vacuum apparatus is evacuated, and an inert gas is introduced into the vacuum apparatus to blow away the unreacted precursor, and then, the atmosphere in the vacuum apparatus is returned to vacuum, and the above steps is repeated until a thickness of a layer formed by the precursor (trimethylaluminum) reaches a design requirement for the first inorganic insulating layer 13.

Herein, a thickness of the inert material layer 12 is related to the usage of the display substrate. For example, the thickness of the inert material layer 12 is in a range of 1 μm to 10 μm, inclusive.

In some embodiments, in a thickness direction of the base substrate 10, a distance between a surface of the inert material layer 12 away from the base substrate 10 and the base substrate 10 is less than a distance between a surface of the first inorganic insulating layer 13 away from the base substrate 10 and the base substrate 10. In this way, forming the inert material layer 12 on the side of the first barrier groups 11 away from the base substrate 10 may not affect an overall thickness of the display substrate.

In S50, the display substrate motherboard is cut along cutting line(s) in the cutting area(s) to obtain display substrates.

In some examples, the display motherboard 100 may be cut by using a laser cutting process.

In some embodiments, the manufacturing method for the display substrate further includes S60.

In S60, a plurality of barrier dams 32 are formed on the base substrate 10. Each display area 101 is surrounded by at least one barrier dam 32, and the at least one barrier dam 32 is disposed at a side of first barrier group(s), corresponding to the display area 101, proximate to the display area 101.

In some examples, a plurality of first barrier dams 321 and a plurality of second barrier dams 322 are formed on the base substrate 10. S60 includes S601, and S601 and S11 are performed simultaneously.

In S601, the first barrier dams 321 and the second barrier dams 322 with different heights may be manufactured by using a halftone mask. That is, the plurality of barrier dams 32 are formed while the dielectric layer is formed.

For example, the plurality of barrier dams 32 are formed while the gate insulating layer is formed.

For another example, the plurality of barrier dams 32 are formed while the interlayer dielectric layer is formed.

In some embodiments, the manufacturing method for the display substrate further includes S70 to S100.

In S70, at least one second barrier group 41 is formed in each display substrate area 103 of the base substrate 10. Each second barrier group 41 includes at least two adjacent second barriers 411, and the at least two adjacent second barriers 411 have a gap region therebetween. An orthogonal projection of the at least one second barrier group 41 on the base substrate 10 is non-overlapping with an orthogonal projection of the first barrier group 11 on the base substrate 10.

In some embodiments, the second barrier group 41 and an active layer are formed by a same patterning process using a halftone mask.

In S80, an inert organic film layer is formed in each gap region.

In some embodiments, S80 includes S802.

In S802, each gap region is filled with the first organic material to form the inert organic film layer.

For example, an inkjet printing process is used to fill each gap region with the first organic material, and then a baking and curing process is performed on the first organic material.

In some embodiments, the second barrier group 41 is located on a surface of the active layer away from the base substrate 10. Based on this, before S802, S80 further includes S801.

In S801, the surface of the active layer away from the base substrate 10 is pre-treated to have hydroxyl groups, so that after the gap region is filled with the first organic material, the first organic material undergoes a hydrolysis reaction or alcoholysis reaction with the hydroxyl groups to form the inert organic film layer.

In some embodiments, S80 includes S802'.

In S802', each gap region is filled with the second organic material, and the second organic material forms a film, so as to form the inert organic film layer.

For example, the plasma surface treatment method is used to pre-treat the surface of the active layer away from the base substrate 10, so that the surface of the active layer away from the base substrate 10 has the active hydroxyl groups.

For another example, the ultraviolet irradiation method is used to pre-treat the surface of the active layer away from the base substrate 10, so that the surface of the active layer away from the base substrate 10 has the active hydroxyl groups.

In S90, a second inorganic insulating layer 14 is formed in the display substrate area 103 and on a side of the at least one second barrier group 41 away from the base substrate 10.

In some examples, the second inorganic insulating layer 14 is formed by using the CVD process.

In some other examples, the second inorganic insulating layer 14 is formed by using the ALD process.

For example, a process of forming the second inorganic insulating layer 14 is the same as the process of forming the first inorganic insulating layer 13.

Based on this, since the inert organic film layer does not react with a raw materials for forming the second inorganic insulating layer 14, the second inorganic insulating layer 14 may not be deposited on a surface of the inert organic film layer away from the base substrate, so that via holes may be formed in the second inorganic insulating layer 14 at positions corresponding to the gap regions.

In some embodiments, the second inorganic insulating layer 14 is the above interlayer dielectric layer. Based on this, S90 and S11 are performed simultaneously.

In S100, removing the inert organic film layer formed in each gap region.

For example, an ashing process is used to remove the inert organic film layer formed in each gap region. Alternatively, other processes may be used to remove the inert organic film layer, which is not limited in the embodiments of the present disclosure.

In some embodiments, after S100, a source-drain metal layer is deposited on a surface of the second inorganic insulating layer 14 away from the base substrate 10. A portion of the source-drain metal layer is filled in the via holes in the second inorganic insulating layer 14 during the deposition process, so that the source-drain metal layer is connected to the active layer.

The deposition process of the source-drain metal layer may be the CVD process or the ALD process.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate motherboard having a plurality of display areas and at least one cutting area located at least among the plurality of display areas; the display substrate motherboard comprising:
    a base substrate;
    a plurality of first barrier groups disposed on the base substrate, each first barrier group being located on at least one side of a corresponding display area and including two first barriers arranged at intervals, a region between the two first barriers being located in a cutting area;
    an inert material layer disposed in the region between the two first barriers; and
    a first inorganic insulating layer disposed on a side of the plurality of first barrier groups away from the base substrate, the first inorganic insulating layer being further located in the plurality of display areas; wherein
    an orthogonal projection of the first inorganic insulating layer on the base substrate is non-overlapping with an orthogonal projection of the inert material layer on the base substrate.

2. The display substrate motherboard according to claim 1, wherein the two first barriers are both disposed around the corresponding display area; and
    the first inorganic insulating layer includes a plurality of first inorganic insulating sub-layers, and each first inorganic insulating sub-layer is located in a corresponding display area and in a region where a first barrier group corresponding to the display area is located.

3. The display substrate motherboard according to claim 1, further comprising:
    one or more sub-barriers, at least one sub-barrier being located in a region between two first barriers of at least one first barrier group, the at least one sub-barrier and the two first barriers being disposed in a same layer; wherein
    the inert material layer covers the one or more sub-barriers.

4. The display substrate motherboard according to claim 1, wherein the first barrier group is disposed on a surface of the base substrate, and the surface has one or more grooves;
    at least one groove is located in a region between two first barriers of at least one first barrier group; and
    the inert material layer covers the one or more grooves; or
    the display substrate motherboard further comprises:
    a dielectric layer disposed between the base substrate and the first barrier group, the first barrier group being disposed on a surface of the dielectric layer away from the base substrate, and the surface having one or more grooves; wherein
    at least one groove is located in a region between two first barriers of at least one first barrier group; and
    the inert material layer covers the one or more grooves.

5. The display substrate motherboard according to claim 1, further comprising:
    a plurality of second barrier groups disposed on the base substrate, an orthogonal projection of each second barrier group on the base substrate being non-overlapping with an orthogonal projection of any first barrier group of the plurality of first barrier groups on the base substrate, the second barrier group including at least two adjacent second barriers, and the at least two adjacent second barriers having a gap region therebetween; and
    a second inorganic insulating layer disposed on a side of the second barrier groups away from the base substrate; wherein
    the second inorganic insulating layer is provided with a plurality of via holes therein, an orthogonal projection of the gap region on the base substrate being overlapping with an orthogonal projection of a via hole on the base substrate.

6. A display substrate having a display area, the display substrate comprising:
    a base sub-substrate,
    a first barrier disposed on the base sub-substrate, the first barrier being located on at least one side of the display area, the first barrier and an edge of the base sub-substrate have a gap therebetween at any side of the display area;
    an inert material pattern disposed between the first barrier and the edge of the base sub-substrate; and
    a first inorganic insulating sub-layer disposed on a side of the first barrier away from the base sub-substrate, the first inorganic insulating sub-layer being further located in the display area, an orthogonal projection of an edge of the first inorganic insulating sub-layer on the base sub-substrate being located within a range of an orthogonal projection of the first barrier on the base sub-substrate at the any side of the display area.

7. The display substrate according to claim 6, wherein the first barrier is disposed around the display area, and orthogonal projections of edges of the first inorganic insulating sub-layer on the base sub-substrate are located within the range of the orthogonal projection of the first barrier on the base sub-substrate.

8. The display substrate according to claim 6, further comprising:
    a planarization layer disposed on the base sub-substrate and located in the display area; and/or
    a pixel defining layer disposed on the base sub-substrate and located in the display area; wherein
    the first barrier is disposed in a same layer as one of the planarization layer and the pixel defining layer.

9. The display substrate according to claim 6, further comprising:
    at least one barrier dam disposed on the base sub-substrate, the at least one barrier dam being disposed at a side of the first barrier proximate to the display area, and each of the at least one barrier dam being disposed around the display area.

10. The display substrate according to claim 9, wherein the at least one barrier dam includes a first barrier dam and a second barrier dam, the second barrier dam and the first barrier dam are arranged at intervals in a direction perpendicular to a thickness direction of the base sub-substrate;

the first barrier dam is disposed around the display area, and the second barrier dam is disposed around the first barrier dam; in the thickness direction of the base sub-substrate, a minimum distance from a surface of the second barrier dam away from the base sub-substrate to the base sub-substrate is greater than a minimum distance from a surface of the first barrier dam away from the base sub-substrate to the base sub-substrate.

11. The display substrate according to claim 6, further comprising:

at least one second barrier group disposed on the base sub-substrate, an orthogonal projection of the at least one second barrier group on the base sub-substrate being non-overlapping with the orthogonal projection of the first barrier on the base sub-substrate, each second barrier group including at least two adjacent second barriers, the at least two adjacent second barriers having a gap region therebetween; and a second inorganic insulating sub-layer disposed on a side of the second barrier groups away from the base sub-substrate; wherein the second inorganic insulating sub-layer is provided with at least one via hole therein, an orthogonal projection of the gap region on the base sub-substrate being overlapping with an orthogonal projection of a via hole on the base sub-substrate.

12. A display apparatus, comprising the display substrate according to claim 6.

13. A manufacturing method for a display substrate, the method comprising:

providing a base substrate, the base substrate having a plurality of display areas and at least one cutting area(s) located at least among the plurality of display areas;

forming a first barrier group including two first barriers on the base substrate and located on at least one side of each display area, a region between the two first barriers being located in a cutting area;

forming an inert material layer in a region between two first barriers of each first barrier group;

forming a first inorganic insulating layer on a side of all first barrier groups away from the base substrate, the first inorganic insulating layer being further located in the plurality of display areas, an orthogonal projection of the first inorganic insulating layer being non-overlapping with an orthogonal projection of the inert material layer on the base substrate; and cutting along at least one cutting line in the cutting area(s) to obtain display substrates each according to claim 6.

14. The method according to claim 13, wherein forming the inert material layer in the region between the two first barriers of each first barrier group includes:

filling the region between the two first barriers of each first barrier group with a first organic material to form the inert material layer.

15. The method according to claim 14, wherein the first barrier group is located on a surface of the base substrate;

before filling the region between the two first barriers of each first barrier group with the first organic material, forming the inert material layer further includes:

pre-treating the surface of the base substrate to make the surface of the base substrate have hydroxyl groups, so that the first organic material reacts with the hydroxyl groups after the region is filled with the first organic material, to form the inert material layer.

16. The method according to claim 14, wherein before forming the first barrier group, the method further comprises:

forming a dielectric layer on the base substrate; wherein before filling the region between the two first barriers of each first barrier group with the first organic material, forming the inert material layer further includes:

pre-treating a surface of the dielectric layer away from the base substrate to make the surface of the dielectric layer away from the base substrate have hydroxyl groups, so that the first organic material reacts with the hydroxyl groups after the region is filled with the first organic material, to form the inert material layer.

17. The method according to claim 14, wherein the first organic material includes one of vinyltriethoxysilane, vinyltriacetoxysilane, and chloromethyltriethoxysilane.

18. The method according to claim 13, wherein forming the inert material layer in the region between the two first barriers of each first barrier group includes:

filling the region between the two first barriers of each first barrier group with a second organic material, the second organic material including one of a polystyrene-based material, a polyethylene oxides-based material, a polymethyl methacrylate-based material and a polyvinylpyrrolidone-based material.

19. The method according to claim 13, further comprising:

forming a plurality of barrier dams on the base substrate, each display area being surrounded by at least one barrier dam, and the at least one barrier dam being disposed at a side of the first barrier group, corresponding to the display area, proximate to the display area.

20. The method according to claim 13, wherein the base substrate has a plurality of display substrate areas, a display area is located in a corresponding display substrate area, and the at least one cutting area is located at least among the plurality of display substrate areas;

the method further comprises:

forming at least one second barrier group in each display substrate area of the base substrate, each second barrier group including at least two adjacent second barriers, the at least two adjacent second barriers having a gap region therebetween, and an orthogonal projection of the at least one second barrier group on the base substrate being non-overlapping with an orthogonal projection of the first barrier group on the base substrate;

forming an inert organic film layer in the gap region;

forming a second inorganic insulating layer in the display substrate area and on a side of all second barrier groups away from the base substrate;

removing the inert organic film layer formed in the gap region.

* * * * *